(12) United States Patent
Yu

(10) Patent No.: US 6,345,211 B1
(45) Date of Patent: *Feb. 5, 2002

(54) METHOD OF USING CRITICAL DIMENSION MAPPING TO OPTIMIZE SPEED PERFORMANCE OF MICROPROCESSOR PRODUCED USING AN INTEGRATED CIRCUIT MANUFACTURING PROCESS

(75) Inventor: Warren T. Yu, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/263,947

(22) Filed: Mar. 8, 1999

(51) Int. Cl.⁷ ............................................... G06F 19/00
(52) U.S. Cl. ............................. 700/121; 250/492; 430/5
(58) Field of Search .............................. 700/121; 716/4; 430/22, 30, 5; 365/120; 250/492; 382/144–145; 355/53

(56) References Cited

U.S. PATENT DOCUMENTS

| | | | |
|---|---|---|---|
| 5,392,361 A | | 2/1995 | Imaizumi et al. |
| 5,646,870 A | * | 7/1997 | Krivokapic et al. ............ 716/4 |
| 5,965,306 A | * | 10/1999 | Mansfield et al. ............ 430/22 |
| 5,985,497 A | * | 11/1999 | Phan et al. .................... 430/30 |
| 5,986,765 A | * | 11/1999 | Nakasuji ....................... 356/399 |
| 6,044,007 A | * | 3/2000 | Capodieci .................... 365/120 |
| 6,115,108 A | * | 9/2000 | Capodieci ..................... 355/77 |
| 6,215,127 B1 | * | 4/2001 | Yu ............................... 250/492 |

OTHER PUBLICATIONS

S. Wolf and R.N. Tauber, Silicon Processing for the VLSI Era, vol. 1—Process Technology, pp. 446–455.

* cited by examiner

Primary Examiner—William Grant
Assistant Examiner—Ronald D Hartman, Jr.

(57) ABSTRACT

In order to optimize the speed performance of a microprocessor, mapping of the critical dimension of predetermined features, such as ring oscillators, test transistors, turning forks WET transistors etc., it carried out at various stages of the manufacturing process. For example, a reticle is mapped, the etch mask is produced from the effect of the image on the resist layer, and the results of the etching can be respectively mapped. The data gleaned from these mappings are use to determine from the end result, what stage or operation in a new manufacturing process which should be adjusted to improve the quality of the end product. Therefore, when a new manufacturing process is introduced into production, it is possible to run the process and then work back via the collected critical dimension data to determined appropriate changes in the settings of a manufacturing process, etching process, resist formulation or the like, to improve the resulting semiconductor device and the associated microprocessor speed performance.

7 Claims, 5 Drawing Sheets

POLY GATE CD MAP FEATURE LOCATION

CD MEASUREMENT SITES

FIG. 4  CD MAP DATA SUMMARY

| TYPE | ORIEN | TARGET | STAT | K6_1 | K6_2 | K6_3 | K6_4 | MEAN | STD | RANGE |
|---|---|---|---|---|---|---|---|---|---|---|
| TR | HOR | DENSE | MEAN | 0.21274 | 0.21298 | 0.21496 | 0.21052 | 0.21280 | .0039807 | 0.0142 |
| TR | HOR | DENSE | STD | 0.00361 | 0.00514 | 0.00303 | 0.00378 | 0.21280 | .0039807 | 0.0142 |
| TR | HOR | DENSE | RANGE | 0.00810 | 0.01240 | 0.00810 | 0.00990 | 0.21280 | .0039807 | 0.0142 |
| TR | HOR | DENSO | MEAN | 0.21962 | 0.21680 | 0.21582 | 0.21038 | 0.21566 | .0053242 | 0.0166 |
| TR | HOR | DENSO | STD | 0.00549 | 0.00306 | 0.00563 | 0.00271 | 0.21566 | .0053242 | 0.0166 |
| TR | HOR | DENSO | RANGE | 0.01190 | 0.00720 | 0.01420 | 0.00590 | 0.21566 | .0053242 | 0.0166 |
| TR | HOR | ISO | MEAN | 0.21834 | 0.21326 | 0.21666 | 0.21508 | 0.21584 | .0044297 | 0.0170 |
| TR | HOR | ISO | STD | 0.00357 | 0.00532 | 0.00354 | 0.00467 | 0.21584 | .0044297 | 0.0170 |
| TR | HOR | ISO | RANGE | 0.00850 | 0.01380 | 0.00980 | 0.01180 | 0.21584 | .0044297 | 0.0170 |
| TR | VER | DENSO | MEAN | 0.21926 | 0.21058 | 0.21338 | 0.21244 | 0.21392 | .0051935 | 0.0164 |
| TR | VER | DENSO | STD | 0.00358 | 0.00277 | 0.00515 | 0.00533 | 0.21392 | .0051939 | 0.0164 |
| TR | VER | DENSO | RANGE | 0.00820 | 0.00710 | 0.01290 | 0.01400 | 0.21392 | .0051935 | 0.0164 |

| TYPE | ORIEN | TARGET | STAT | K6_1 | K6_2 | K6_3 | K6_4 | MEAN | STD | RANGE |
|---|---|---|---|---|---|---|---|---|---|---|
| RINGOS | HOR | DENSE | MEAN | 0.21318 | 0.21008 | 0.21106 | 0.21074 | 0.21127 | .0032030 | 0.0144 |
| RINGOS | HOR | DENSE | STD | 0.00233 | 0.00250 | 0.00541 | 0.00105 | 0.21127 | .0032030 | 0.0144 |
| RINGOS | HOR | DENSE | RANGE | 0.00530 | 0.00690 | 0.01440 | 0.00210 | 0.21127 | .0032030 | 0.0144 |
| RINGOS | HOR | DENSO | MEAN | 0.21158 | 0.20790 | 0.20924 | 0.20658 | 0.20883 | .0047685 | 0.0155 |
| RINGOS | HOR | DENSO | STD | 0.00518 | 0.00218 | 0.00526 | 0.00563 | 0.20883 | .0047685 | 0.0155 |
| RINGOS | HOR | DENSO | RANGE | 0.01330 | 0.00590 | 0.01180 | 0.01470 | 0.20883 | .0047685 | 0.0155 |
| RINGOS | HOR | ISO | MEAN | 0.21224 | 0.20728 | 0.20934 | 0.21076 | 0.20991 | .0048506 | 0.0145 |
| RINGOS | HOR | ISO | STD | 0.00365 | 0.00620 | 0.00541 | 0.00373 | 0.20991 | .0048506 | 0.0145 |
| RINGOS | HOR | ISO | RANGE | 0.00980 | 0.01450 | 0.01130 | 0.00980 | 0.20991 | .0048506 | 0.0145 |

| TYPE | ORIEN | TARGET | STAT | C | LL | LR | MEANS | UL | UR | STD | RANGE |
|---|---|---|---|---|---|---|---|---|---|---|---|
| WET | VER | DENSO | MEAN | 0.20245 | 0.20570 | 0.21142 | 0.21062 | 0.20808 | 0.20720 | .0042157 | 0.0106 |
| WET | VER | DENSO | STD | 0.00546 | 0.00374 | 0.00617 | | 0.00298 | 0.00485 | | |
| WET | VER | DENSO | RANGE | 0.01560 | 0.00980 | 0.01750 | | 0.00860 | 0.01150 | | |

| TYPE | ORIEN | TARGET | STAT | MEAN | STD | RANGE |
|---|---|---|---|---|---|---|
| TF | VER | DENSO | MEAN | 0.20697 | .0053506 | 0.0244 |
| TF | VER | DENSO | STD | 0.20697 | .0053506 | 0.0244 |
| TF | VER | DENSO | RANGE | 0.20607 | .0053506 | 0.0244 |

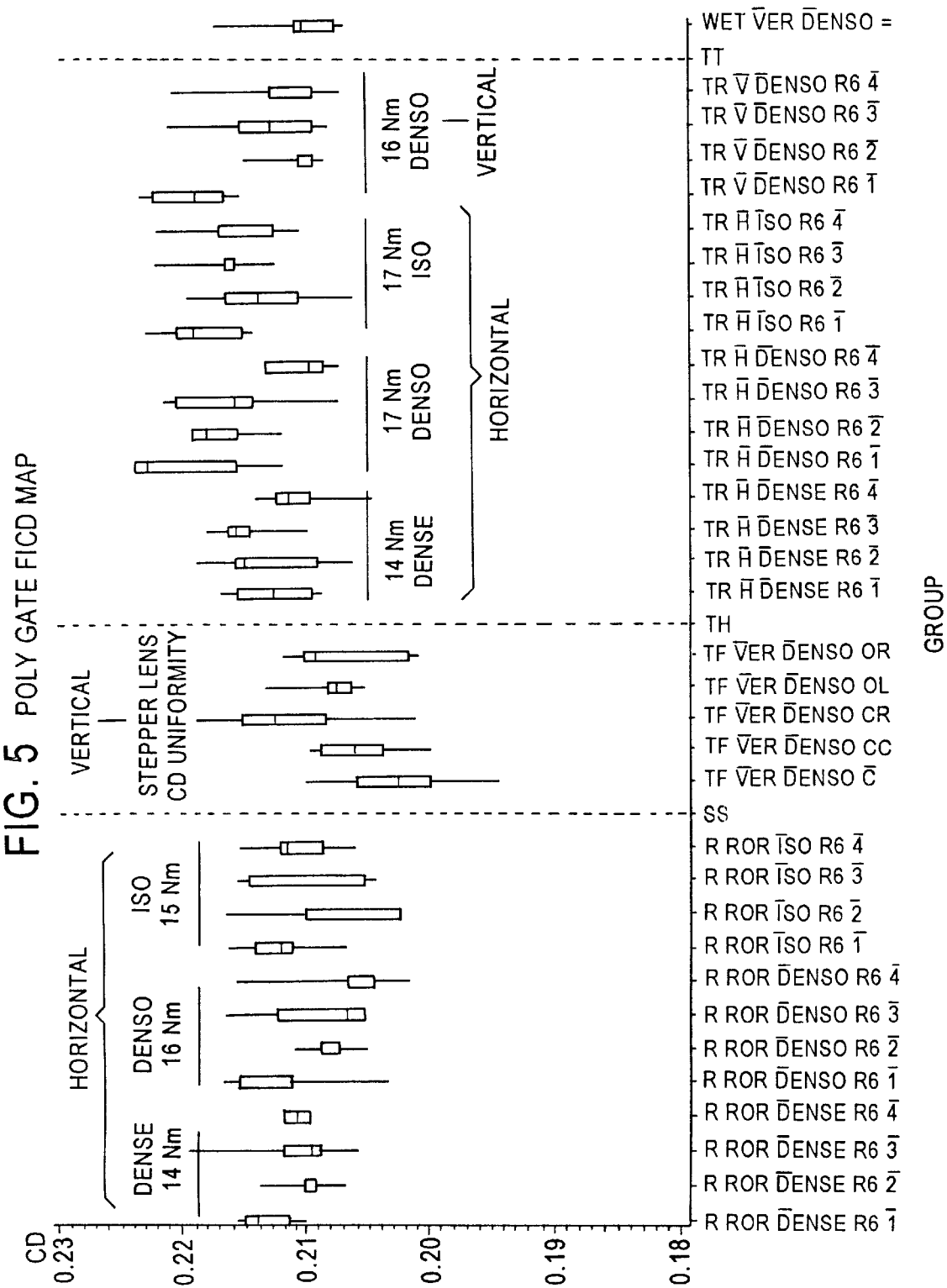
FIG. 5 POLY GATE FICD MAP

METHOD OF USING CRITICAL DIMENSION MAPPING TO OPTIMIZE SPEED PERFORMANCE OF MICROPROCESSOR PRODUCED USING AN INTEGRATED CIRCUIT MANUFACTURING PROCESS

BACKGROUND OF THE INVENTION

1. Field of the Invention

The present invention relates generally to techniques which are used during the fabrication of semiconductor devices. More specifically, the invention relates to a technique which uses multiple mappings of critical dimensions of selected features formed on a wafer during the process of forming integrated circuits, to enable a new fabrication/manufacturing process to be calibrated/qualified in an efficient manner and to enable the production of an a microprocessor chip wherein the speed of the processor is optimized.

2. Description of the Related Art

The speed of a processor is dependent on the degree of accuracy with which the individual features of its integrated circuit (IC) are manufactured. For example, if a line has a curve or bend in it and the width of the line varies, e.g. narrows, then the amount of resistance of the line will vary and the resulting speed with which data is transferred from one point to another will be affected/impaired. In addition, heat will be generated at the narrower, higher resistance locations. With the development of localized heating, the amount of resistance tends to be increased. This process can, of course, in the worse case scenario, escalate until such time as a hot spot causes the line to fail and the circuit associated therewith is highly impaired or rendered inoperative.

Accordingly, the process of manufacturing the microprocessor needs to be examined in order to ensure that all of the features which impact the speed and efficiency are being formed optimally and free of defects of the nature alluded to above.

The term process or method should be understood throughout the following disclosure to mean at least the combination of a number of different process or method steps including resist coating, exposure via a reticle/photolithographic operation or election beam scanning, etch/implantation mask formation, etching or implantation, etc. This term should also be taken to include the use of hardware which affect the processes or methods being carried out. For example, in order to assure the correct processing is carried out, it is necessary to ensure that the operation of a stepper and associated robotics and transport mechanisms, for example, are appropriately calibrated, the etch mixtures/recipes are tuned to the required levels to avoid under or over etching, undercutting and the like.

Calibration or qualifying of the stepper is necessary before production can begin. It is also necessary to calibrate the operation of the wafer track and associated robotics in order to determine that the wafer is being moved between and disposed in the stepper and processing chambers (e.g. etching chambers) in an optimally correct manner, and thus assure that the wafer is reproducibly set on the table of the stepper in a correctly oriented and located position, each and every time.

Further, during the fabrication of an integrated circuit (IC) it is necessary to impress images on resist coating and to etch, deposit, implant or the like, a number of times before the devices on the wafer are completed and the wafer is ready for dicing. It is, therefore, necessary to ensure that the hardware used to move the wafer(s) back and forth, manipulate and to photolithograph, is operating in a manner such that each and every wafer undergoes the same manipulations/operations during each and every stage of production. For example, accurate reproducible location of the wafer in the stepper is necessary. U.S. Pat. No. 5,392,361 issued on Feb. 21, 1998 in the name of Imaizumi et al., discloses the use of a mark on the wafer and a mark position detecting method and apparatus which uses fuzzy logic to improve alignment accuracy.

For further examples of the type of arrangements which are associated with the tool set, reference can be had to U.S. Pat. No. 4,641,071 issued in Feb. 1987 in the name of Tazawa et al, and U.S. Pat. No. 4,719357 issued in Jan. 1998 in the name of Ayata et al.

It is also necessary to ensure that all of the other processes which are conducted during the IC fabrication are also working in "concert" with the hardware and the computer/numerical controls which are associated therewith. Feedback arrangements which monitor the temperature of the surface of tile wafer during plasma etching, for example, should it be used during the fabrication, is preferably checked to see if the parameter is being accurately detected and reported.

With respect to the etching process which inevitably form part of the manufacturing process, reference may be had to U.S. Pat. No. 3,909,325 issued on Sep. 30, 1975 to Church et al. which discloses an example of wet etching that uses a combination of potassium hydroxide, ethylene glycol and water. This reference is hereby incorporated herein by reference. For an example of plasma etching, reference may be had to U.S Pat. No. 4,115,184 which was issued on Sep, 19 1978 in the name of Poulsen. The content of this document is also incorporated herein by reference.

However, no matter what measures are taken, in the final analysis, the only way of determining if all of the necessary adjustments have in fact been made in all optimal manner is to make a test run and to examine the end product (viz., conduct empirical testing). However, this technique tends to leave it to chance as to which adjustment or setting needs to be fine tuned to bring this highly complex arrangement into truly optimal operational status. That is to say, the settling and arrangeent of the reticle which is set in the optics of the stepper must be carefully examined in order to determine if adjustments to this vital piece of apparatus is necessary to correct some less than desirable outcome of the IC production.

Accordingly, the present invention provides a type of feedback of approach. For example, an adjustment to the stepper operation, the robotics which move the wafers from the wafer track to the stepper table, the position to which the wafer track moves the wafers prior transfer, in combination with a possible change in the reticle or even an resist or etching recipe, may, even though it would appear contrary to what might be conventionally considered to be correct and/or appropriate, enable the end result to be improved.

Nevertheless, without some form of sophisticated analysis which can be carried out in a reliable and reproducible manner, the above types of adjustment and changes in technique amount to nothing more than guess work. Accordingly, there remains a need for a reliable technique via which microprocessor speed performance can be optimized through the identification of the problem which need to be addressed in order to achieve the required speed performance optimization.

SUMMARY OF THE INVENTION

The present invention provides a technique wherein a type of feedback control, based on accumulated critical dimension (CD) mapping data of a suitably large number of different features which are produced in an integrated circuit (IC) arrangement, is implemented in a manner that enables the optimization of microprocessor speed performance.

More specifically, the underlying technique is based on a sequence of mappings which are carried out at each of a select number of production stages/steps, and wherein CD data is accumulated during each of the mappings is examined, compared and used to determine what adjustments should be made at various stages of the manufacture to ensure that the closest possible adherence to the design requirements and, therefore, the speed performance of the microprocessor, is achieved.

In other words, the present invention enables the use of an effective to feedback control data base. For example, if the mapping of results of the etching are examined and it is found that a line width or corner is too great or too small, or the configurations of given features are not as good as is required to assure the best performance of the device (e.g., features necessary to optimize the speed performance of a microprocessor), then it is possible to determine what adjustments can/should be made to the various pieces of apparatus and/or processes which are involved in the manufacturing process so as to influence the processes at each of the stages which are involved in the process, and to instigate changes/adjustments which will enable improvements to be made and for optimized microprocessor speed performance to be realized.

In particular, this technique, in accordance with the present invention, enables the a manufacturing process be to checked/modified so as to achieve the best possible results and thus optimize speed performance of the microprocessor. Once the operation of the stepper and associated apparatus, such as a wafer track, for example, is modified/adjusted and its performance is assured, and the etching and the like type of operations which are carried out, are determined to be appropriately tuned, the amount of mapping which is subsequently used can possibly be reduced to a level which is necessary to determine that the process is running properly and that the reticle or etch recipe (for example) are optimally tuned.

More specifically, a first aspect of the invention resides in a method of optimizing microprocessor speed performance, the method comprising the steps of: mapping the critical dimensions of a predetermined plurality of microprocessor features at each of a plurality of selected exposure fields of at least one of a predetermined number of production stages or steps of a wafer on which a plurality of microprocessor circuits are fabricated; comparing the data collected at each of the mappings; and determining, from the comparison, what changes are required in a set-up of a predetermined piece of apparatus or process which is used in at least one of a plurality of production stages, needs to be adjusted in order to bring at least one critical dimension of at least one of the predetermined features into agreement with at least one of a predetermined set of design critical dimensions and thus optimize microprocessor speed performance.

In the above method the predetermined features comprise ring oscillators, turning forks, test transistors, and wafer electrical testing-purpose (WET) transistors.

A second aspect of the present invention resides in a method of optimizing microprocessor speed performance, the method comprising the steps of: exposing a predetermined number of exposure fields on the wafer using one of a photolithographic technique or an electron beam technique; developing and mapping critical dimension of all features that impact integrated circuit speed performance of a microprocessor, including ring oscillators, turning forks, test transistors, and WET transistors, which are located in the exposure field, and which are contained in a selected group of the predetermined number of exposure fields, at least two different stages of production; comparing the mapped critical dimension with a set of corresponding prerequisite critical dimension values; and adjusting an operation at least at one of the two different stages of production in order to bring the critical dimension which are derived using the mapping into accordance with a difference between the mapped critical dimension and the prerequisite critical dimension values to optimize microprocessor speed performance.

Another aspect of the present invention resides in a method of optimizing microprocessor speed performance, wherein the production of the microprocessor integrated circuitry includes the use of a stepper, a wafer track, and robotic apparatus for selectively moving a wafer between at least the stepper and a reaction chamber and for reproducibly locating the wafer in each of same, the method comprising the steps of: mapping predetermined features of a reticle which is included in the stepper, to determine a first set of critical dimension data; mounting the reticle in a stepper and operating the stepper to move the substrate into a predetermined series of positions with respect to the reticle; impressing an image produced by the reticle onto a layer of photo resist formed on the wafer at each of the predetermined series of positions to form a corresponding plurality of exposure fields; removing the portion of the photo resist effected by the image impression to develop a photo resist mask pattern; mapping the predetermined features as they are formed in the photo resist mask pattern for each of selected exposure fields selected from among the plurality of exposure fields, to determine a second predetermined set of critical dimension data for the pattern; etching the wafer through the photo resist mask pattern; removing at least one portion of the photo resist mask pattern to reveal an etched pattern formed in the wafer; mapping the predetermined features in the etched pattern corresponding to each of the selected exposure fields and recording a third set of critical dimension data; repeating the steps of impressing, removing, mapping, etching, removing and mapping, in at least one subsequent fabrication stage; a comparing the first, and at least one of the second and third sets of critical dimension data with each other and/or a predetermined set of standard critical dimension data values; and determining an adjustment to at least one step of the process which is required to reduce a difference between the third set of critical dimension data and the predetermined set of critical dimension data and to optimize microprocessor speed performance.

In the above method the step of mapping comprises mapping a predetermined plurality of exposure fields which are clustered at a center portion of the wafer. More specifically, the predetermined plurality of exposure fields is five, and the predetermined features comprise ring oscillators, turning forks, test transistors, and WET transistors.

BRIEF DESCRIPTION OF THE DRAWINGS

The various aspects and advantages of the present invention will become better understood as a description of the preferred embodiments is given with reference to the appended drawings in which:

FIG. 4 is a table showing the results which are graphed in FIG. 4; and

FIG. 5 is a graph showing an example of the results derived using the mapping technique.

DETAILED DESCRIPTION OF THE PREFERRED EMBODIMENTS

Figure 1:
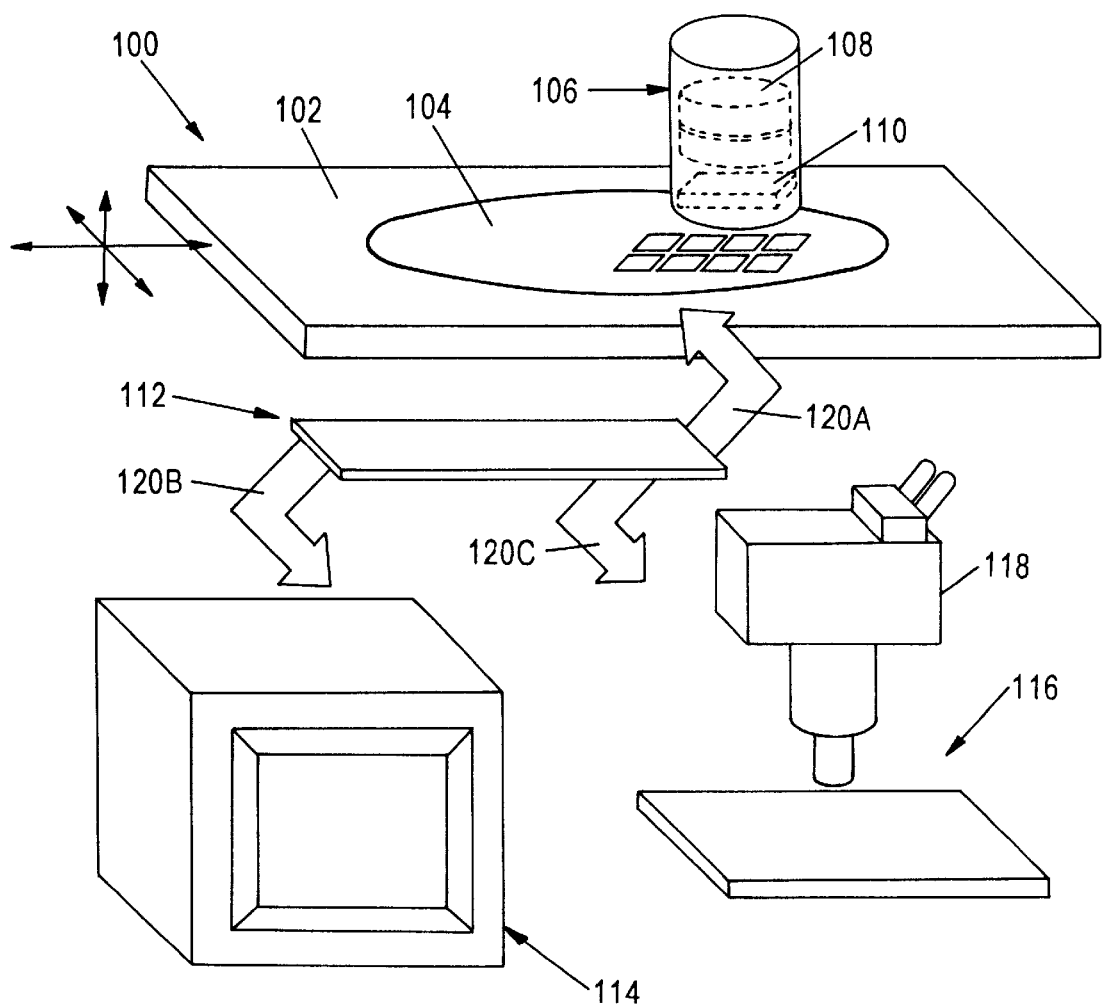
FIG. 1 is a schematic perspective view of a stepper, wafer track, reaction/process chamber, and scanning station, wherein the stepper includes an optical system in which a reticle is mounted and a moveable table on which a wafer is carried.

FIG. 1 schematically shows a stepper 100 which includes a table 102 adapted to support and hold wafers 104 thereon, and an optical system 106 which includes a source of radiant energy 108 and a reticle 110 for determining the pattern which is imprinted on the wafer. A wafer track which is use to move the wafers to and from the stepper, is denoted by the numeral 112. In this figure, the wafer track 112 is shown as being arranged to transport the wafer 104 between the stepper 100, a processing unit 114 in which etching (for example) can be carried out, and a mapping station 116 in as which the features which are formed, can be measured via an electron microscope or the like device 118. Robotics which are associated with the wafer track and which are used to move the wafers from one device to another are designated by the numerals 120A, 120B and 120C.

As will be appreciated, this view is highly schematic and omits all but the outlines of the basic elements of the stepper 100, wafer track 112, processing unit or chamber 114, mapping station 116 and robotics 120A–120C. Further, only a limited number of chip outlines are shown on the wafer 104 and the overall arrangement is not drawn to scale nor is intended to accurately represent the actual structures of the respective devices. For further details pertaining to the construction, control and operation of steppers reference may be had to U.S. Pat. No. 5, 392,361 issued on Feb. 21, 1995 in the name of Imaizumi et al. For details pertaining to wafer tracks and associated apparatus, reference may be had to U.S. Pat. No. 5,685,588 issued to Wong et al. on Nov. 11, 1997.

In accordance with the present invention, before the stepper 100 is used to imprint the image which is produced by the reticle 110, repeatedly and sequentially over the surface of a resist covered wafer 104, a predetermined number of key features which are present on the reticle, are mapped and a first set of data is obtained.

Figure 2:
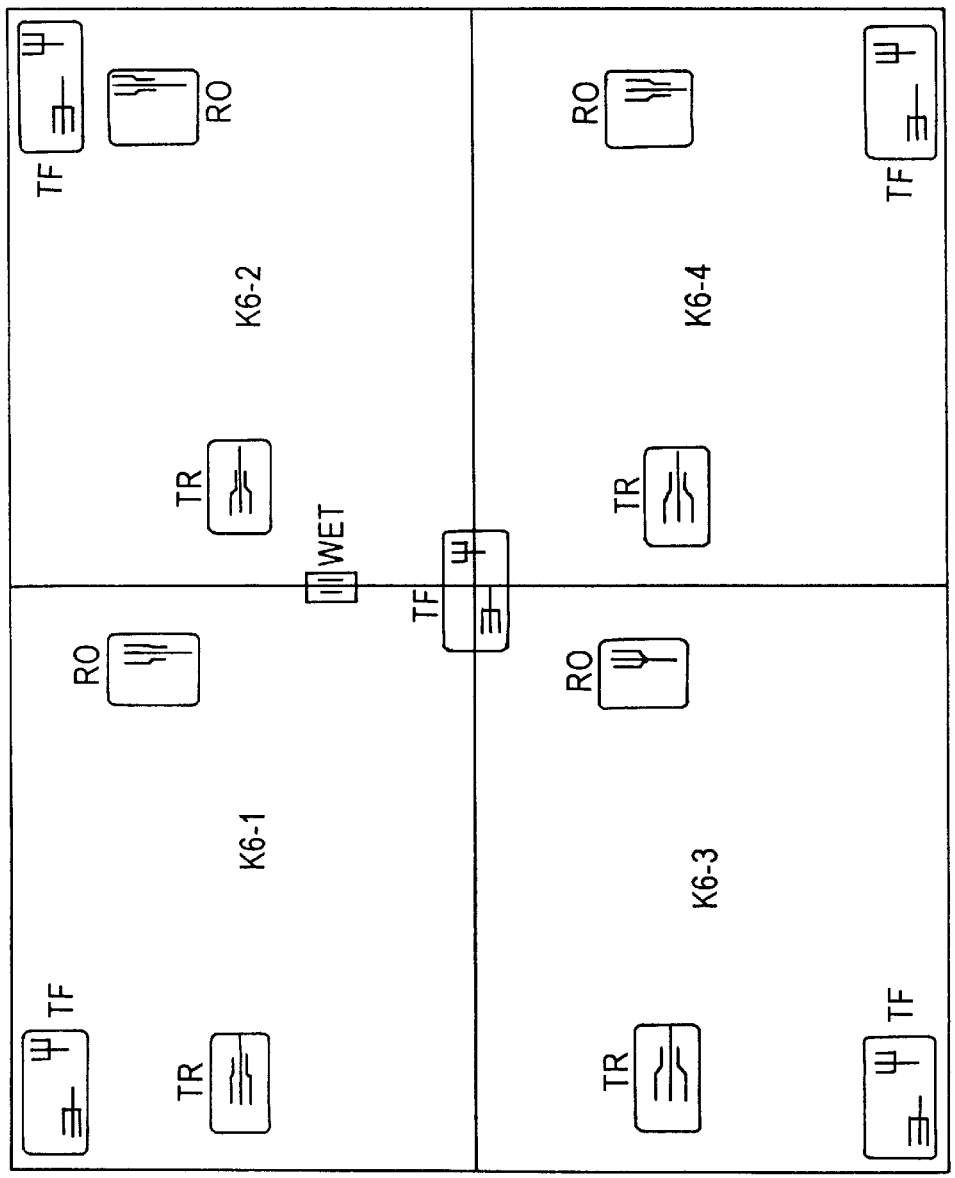
FIG. 2 is an enlarged view of an exposure field showing the features which are mapped in accordance with the present invention.

FIG. 2 shows an example of the locations of the multiple features which are mapped in accordance with the present invention. As will be appreciated from this figure, a tuning fork feature TF is located at each of the four corners of the exposure field. A fifth tuning fork feature TF is formed at the center of the field at a location wherein the four quadrants K6-1, K6-2, K6-3 and K6-4 of the field, intense another. Each of these features has a horizontal element and a vertical element.

In addition to the above mentioned elements, four ring oscillators RO and four test transistors TR are located in the illustrated locations. In this illustration, a single WET (Wafer Electrical Testing) transistor spans the boarder of the K6-1 and K6-2 quadrants of the exposure field. It will be understood from the following data that the test transistors, which are subjected to measurement in accordance with the present invention, have both vertical and horizontal elements which are subject to CD measurement.

Table I below clarifies the element/function relationship which exists in accordance with a preferred embodiment of the invention.

TABLE I

Poly Gate C.D. Map Features and Functions

| | Feature | | Function |
|---|---|---|---|
| (1) Ring Oscillator | DENSE | K6 1/2/3/4 | Directly Impacting Speed |
| Horizontal | DENSO | K6 1/2/3/4 | Performance and Sort Yield |
| (R) | ISO | K6 1/2/3/4 | |
| (2) Tuning Fork | DENSO, C (CENTER) | | No Electrical Value, |
| Vertical | DENSO, LL (LOWER LEFT) | | For Measurement of Stepper |
| (TF) | DENSO, LR (LOWER RIGHT) | | Lens Field CD Control |
| | DENSO, UL (UPPER LEFT) | | Uniformity Only |
| | DENSO, UR (UPPER RIGHT) | | |
| (3) Test Transistor | DENSE | K6 1/2/3/4 | Directly Impacting Speed |
| Horizontal | DENSO | K6 1/2/3/4 | Performance and Sort Yield |
| (TR) | ISO | K6 1/2/3/4 | |
| Vertical | DENSO | K6 1/2/3/4 | |
| (4) WET Transistor | DENSO | | For Process Electrical |
| Vertical | | | Evaluation Only |
| (WET) | | | (Electrical CDs) |

Figure 3:
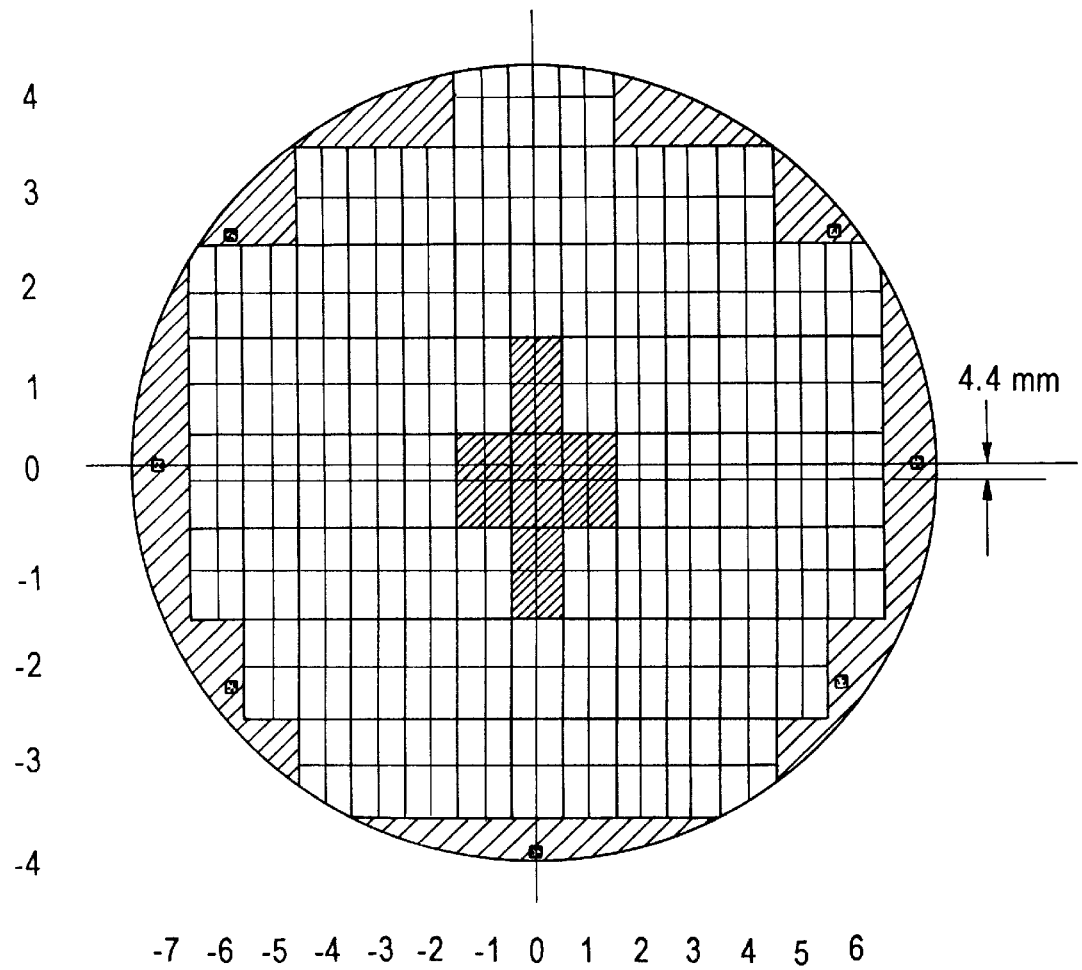
FIG. 3 is a plan view of a wafer showing the positions of the exposure fields in which mapping according to the present invention is carried out.

The mapping according to an embodiment of the invention is carried out on the cluster of five center exposure fields which are shown in fine hatching at the center of the wafer 104 in FIG. 3.

FIG. 4 shows an example of the data which is collected using a mapping which is carried out in accordance with the present invention while FIG. 5 shows this data in graphical form.

Embodiments of the present invention include optimizing by conducting more than one mapping is carried out in order to determine the best effect/modification which can be made to the manufacturing process which is being qualified or calibrated in preparation for production. That is to say, the effect of an etching step, for example, which is carried out between the imprinting of the image on the resist layer and the final mapping which is carried out, can have a large effect on the decision as to what modifications to the positioning operations that are carried out by the stepper which need to be made in order to rectify the process and to ensure that the CDs of the final product are as close to the design specifications as possible.

Accordingly, after the CD data for the features listed in the above table are measured via a mapping of the reticle at the mapping station 116, the reticle 110 is set in the stepper 100 and a photo resist covered wafer is sequentially imprinted to form a plurality of exposure fields. Following this, the wafer 104 is transferred to the reaction chamber 114, wherein portions of the resist layer are removed to reveal the etch mask. The wafer 104 is then removed and the CDs of the same features which were mapped oil the reticle, are again mapped at the mapping station 116 and the data recorded along with that for the reticle.

The wafer 104 is then moved back along the wafer track 114 to the reaction chamber 114 wherein etching is carried out. This etching can take the form of dry etching, wet etching plasma etching or the like. The etching mask is then removed by a well known technique such as by dissolution or by oxidation. Inasmuch as each of these process are very well known in the IC fabrication art, further explanation of this stage will be omitted for brevity.

The etched wafer 104 is then removed from the chamber 114 and transported back to the mapping station 116 whereat each of the features which have been previously mapped are again mapped. This data is then stored.

This process of coating the upper surface of the wafer with resist, exposing surface to form a plurality of exposure fields, the removal of portions of the resist to form an etch or implantation mask, the mapping of the further features which have been formed in the mask and the subsequent etching (for example) and the mapping of the same, can be carried one or more times while collecting pertinent data at each of the mappings.

The three sets of data are then compared to determine if the process is proceeding in a manner which is satisfactory and that the final product, i.e. the etched wafer is being produced with the features in such a condition that the speed performance and the like of the device, which is being constructed using the above mentioned steps, will be as good as desired. This comparison can reveal a great deal of information and provide guidance as to how to adjust one or more stages of the process to improve the end result. However, while the resist recipe, the etch recipe/parameters, the operation of the stepper and or wafer track, can have a profound influence on the IC which is produced, it is time effect that the settings of the combination of all of these processes/devices which is the center of attention, in in this instance.

It is deemed essentially self-evident to the person skilled in the art of producing IC circuits, once having been provided with the above disclosure, how the multiple mapping of the invention can be used to show how the process proceeds and what feedback adjustments need to be made to the various pieces of apparatus and/or processes which individually add up to the manufacturing process as a whole, in order to achieved the desired end. Examples of the manner in which the above type of data can be interpreted and used, is given in U.S. Pat. 5,646,870, issued on Jul. 8, 1997, in the name of Krivokapic et al. This reference deals with process simulation and statistical analysis of CD values. The content of this reference is hereby incorporated by reference thereto.

It will be further appreciated that while only a photolithic process which utilizes visible or UV light and an reticle has been disclosed and described in the specification and drawings, it is possible that this technique can be replaced with an electron beam imprinting technique or the like, if so desired and that this falls within the basic purview of the invention which is limited only by the appended claims.

More specifically, in the case wherein data is gathered via the mapping of poly gate CD for a new microprocessor product, if the collected data show any of the biases between Ring Oscillator K6 1/2/3/4 and the Test Transistor K6 1/2/3/4 as well as iso/dense/denso and vertical/horizontal features (see table 1 and FIG. 5) are greater than 20 nm, the speed performance and the sort yield of the microprocessor are not optimized. The improvements of the speed performance and sort yield can be made through reticle CD and OPC (Optical Proximity Correction), stepper partial coherence adjustment and etch recipe change using this poly gate CD mapping technique.

Only the preferred embodiments of the present invention and but a few examples of its versatility are shown and described in the present disclosure. However, it is to be understood that the present invention is capable of use in various other combinations and environments and is capable of changes or modifications with the scope of the inventive concept expressed herein.

What is claimed is:

1. A method of optimizing microprocessor speed performance, wherein the production of the microprocessor integrated circuitry includes the use of a stepper, a wafer track and robotic apparatus for selectively moving a wafer between at least the stepper and a reaction chamber and for reproducibly locating the wafer in each of same, the method comprising the steps of:

mapping predetermined features of a reticle which is included in the stepper, to determine a first set of critical dimension data;

mounting the reticle in a stepper and operating the stepper to move the substrate into a predetermined series of positions with respect to the reticle;

impressing an image produced by the reticle onto a layer of photo resist formed on the wafer at each of the predetermined series of positions to form a corresponding plurality of exposure fields;

removing the portion of the photo resist effected by the image impression to develop a photo resist mask pattern;

mapping the predetermined features as they are formed in the photo resist mask pattern for each of selected exposure fields selected from among the plurality of exposure fields, to determine a second set of critical dimension data for the pattern;

etching the wafer through the photo resist mask pattern;

removing at least one portion of the photo resist mask pattern to reveal an etched pattern formed in the wafer;

mapping the predetermined features in the etched pattern corresponding to each of the selected exposure fields and recording a third set of critical dimension data;

repeating the steps of impressing, removing, mapping, etching, removing and mapping, in at least one subsequent fabrication stage;

comparing the first, and at least one of the second and third sets of critical dimension data with each other and/or a predetermined set of standard critical dimension data values; and determining an adjustment to at least one step of the process which is required to reduce a difference between the third set of critical dimension data and the predetermined set of critical dimension data to optimize microprocessor speed performance.

2. A method as set forth in claim 1, wherein the step of mapping comprises mapping a predetermined plurality of exposure fields which are clustered at a center portion of the wafer.

3. A method as set forth in claim 2, wherein the predetermined plurality exposure fields is five.

4. A method as set forth in claim 1, wherein the predetermined features comprise ring oscillators, turning forks, test transistors, and wafer electrical testing-purpose (WET) transistors.

5. A method used in forming a microprocessor on a wafer and enabling microprocessor speed performance to be optimized, the method comprising the steps of:

mapping the critical dimensions of a predetermined plurality of microprocessor features on an element, used in forming the plurality of microprocessor features on the wafer, to obtain a first set of critical dimension data;

using the element in a first processing of the wafer to form the predetermined plurality of microprocessor features on said wafer and then mapping the critical dimension of said predetermined plurality of microprocessor features to obtain a second set of critical dimension data;

performing a second processing of the wafer and then mapping the critical dimension of all said predetermined plurality of microprocessor features on said wafer to obtain a third set of critical dimension data;

comparing the first, second and third sets of critical dimension data and a predetermined set of standard critical dimension data values; and determining, from the comparison, what changes are required in a set-up of a predetermined piece of apparatus or process which is used in at least one of a plurality of production stages, to bring at least one critical dimension of at least one of the predetermined plurality of microprocessor features into agreement with at least one of a predetermined set of design critical dimensions, thereby optimizing microprocessor speed performance.

6. The method as set forth in claim 5, wherein the predetermined plurality of microprocessor features comprise ring, oscillators, turning forks, test transistors, and wafer electrical testing-purpose (WET) transistors.

7. A method used in a process of fabricating a microprocessor on a wafer and enabling microprocessor speed performance to be optimized, the method comprising the steps of:

mapping predetermined features of an element used in the process of fabricating the microprocessor on a wafer to obtain a first set of critical dimension data, the predetermined features including ring oscillators, turning forks, test transistors, and wafer electrical testing-purpose (WET) transistors;

using said element in a first production stage of the process of fabricating the microprocessor on a wafer and then mapping the predetermined features to obtain a second set of critical dimension data;

performing a second production stage of fabricating the microprocessor on a wafer and then mapping the predetermined features to obtain a third set of critical dimension data;

comparing the first set of critical dimension data with at least one of the second and third sets of critical dimension data; and using a result of the step of comparing to determine an adjustment to at least one step of the process of fabricating the microprocessor on a wafer to a difference between the third set of critical dimension data and a design set of critical dimension data.

\* \* \* \* \*